(12) United States Patent
Gayet

(10) Patent No.: US 6,525,393 B1
(45) Date of Patent: Feb. 25, 2003

(54) SEMICONDUCTOR SUBSTRATE HAVING AN ISOLATION REGION

(75) Inventor: Philippe Gayet, Saint Vincent de Mercuze (FR)

(73) Assignee: SGS-Thomson Microelectronics S.A., Gentilly (FR)

( * ) Notice: Subject to any disclaimer, the term of this patent is extended or adjusted under 35 U.S.C. 154(b) by 0 days.

(21) Appl. No.: 09/053,405

(22) Filed: Apr. 1, 1998

Related U.S. Application Data

(62) Division of application No. 08/649,248, filed on May 17, 1996, now Pat. No. 5,736,451.

(30) Foreign Application Priority Data

May 19, 1995 (FR) .......................................... 95 069266

(51) Int. Cl.[7] .......................... H01L 29/00; H01L 23/58
(52) U.S. Cl. ........................................ 257/506; 257/647
(58) Field of Search ................................ 257/509, 506, 257/524, 510, 647; 438/207, 218, 219, 221, 294, 296, 427

(56) References Cited

U.S. PATENT DOCUMENTS

| | | | | |
|---|---|---|---|---|
| 4,682,408 A | * | 7/1987 | Takebayashi | 148/DIG. 70 |
| 4,743,566 A | | 5/1988 | Bastiaens et al. | 257/354 |
| 5,118,641 A | | 6/1992 | Roberts | 438/443 |
| 5,374,585 A | | 12/1994 | Smith et al. | 438/443 |
| 5,554,560 A | | 9/1996 | Hsue et al. | 438/443 |
| 5,661,335 A | * | 8/1997 | Anjum et la. | 257/506 |
| 6,008,526 A | * | 12/1999 | Kim | 257/509 |

FOREIGN PATENT DOCUMENTS

JP    1-220467    *    9/1989

OTHER PUBLICATIONS

French Search Report from French Patent Application No. 95 06266, filed May 19, 1995., dated Mar. 1, 1996.
1987 Symposium on VLSI Technology Digest of Technical Papers May 18–21, 1987, New York, pp 19–20 P.A. Van Der Plas, et al. "Field Isolation Process for Submicron CMOS".
Extened Abstracts of the 1993 International Conference on Solid State Devices and Materials 29–08/ Jan. 9, 1993, 1993 Tokyo JA, pp 892–894, W.S. Yang, et al. "Bird's Beak Controlled Poly Buffered Locos Isolation (BPBL) Technology for 256MB DRAM".
Solid State Technology, vol. 37, No. 11, Nov. 1994 Washington, US, pp 67–72, S.S. Kim, et al. "High Pressure and High Temperature Furnace Oxidation For Advances Poly –Buffered Locos".

* cited by examiner

Primary Examiner—Steven Loke
Assistant Examiner—Hung Kim Vu
(74) Attorney, Agent, or Firm—Wolf, Greenfield & Sacks, P.C.; James H. Morris; Gary S. Engelson

(57) ABSTRACT

A method for producing an isolation region on a surface of a semiconductor substrate includes: forming and patterning a masking layer; forming an isolating layer so that a notch exists between an edge of the masking layer and the upper surface of the isolating layer; forming a filling layer over the masking layer and the isolating layer, so that it completely fills the notch; forming field protection spacers adjacent to the masking layer; partially removing the filling layer to expose the upper surface of the isolation layer, the notch remaining filled with a part of the filling layer; and selectively etching the isolating layer from its upper limit until this upper limit is substantially coplanar with the upper surface of the semiconductor substrate. A transistor may be produced in a semiconductor substrate, having a minimum gate length, a minimum width isolation region and wide field isolation region. The isolation regions have substantially coplanar surfaces, also coplanar with an upper surface of the semiconductor substrate. The wide field isolation region has, in an upper surface, a hollow located a distance p from an interface with the upper surface of the semiconductor substrate and the minimum width isolation region has a width less than the sum of the gate length and 2 p.

4 Claims, 7 Drawing Sheets

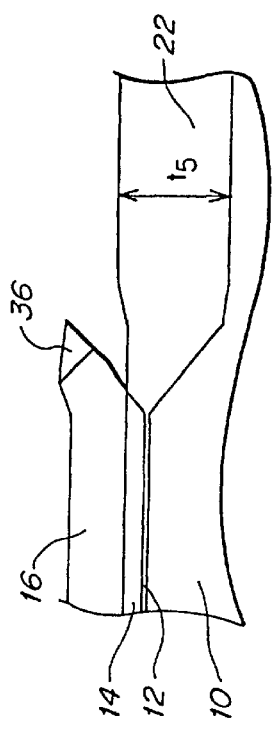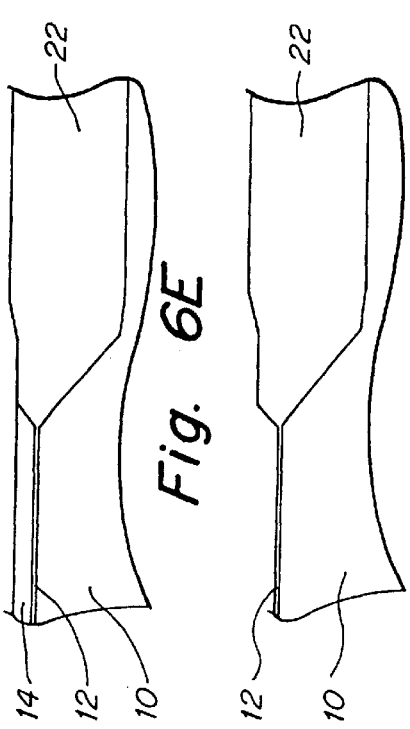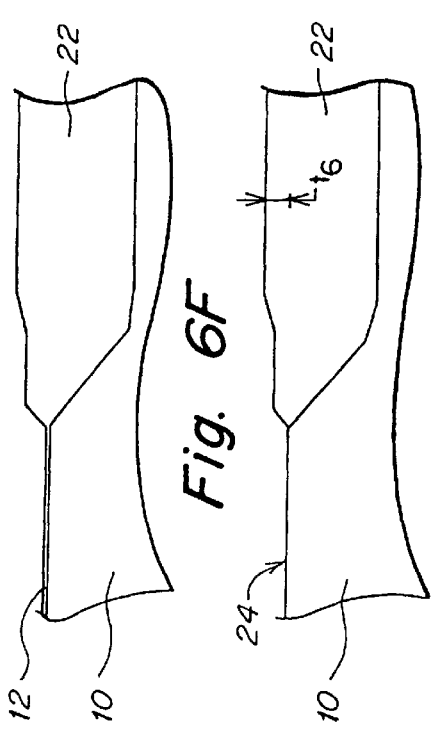
Fig. 6D  Fig. 6E  Fig. 6F  Fig. 6G
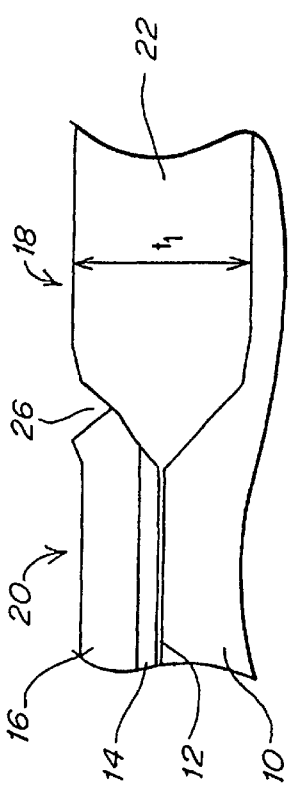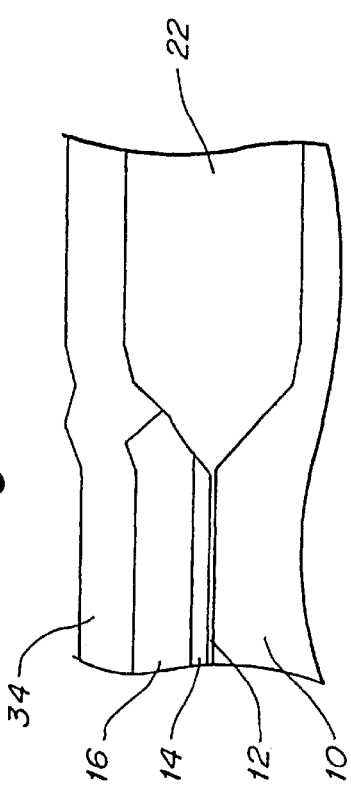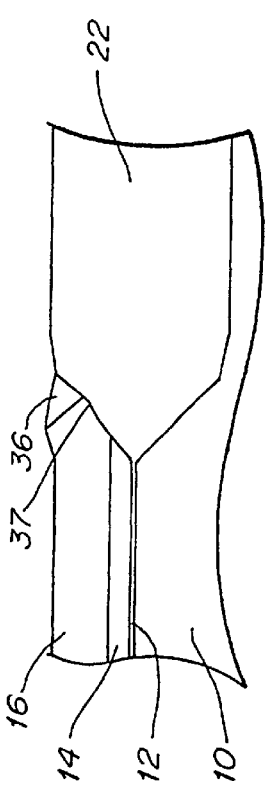
Fig. 6A  Fig. 6B  Fig. 6C

SEMICONDUCTOR SUBSTRATE HAVING AN ISOLATION REGION

This application is a division of application Ser. No. 08/649,248, filed May 17, 1996, entitled METHOD OF FORMING PLANAR ISOLATION IN INTEGRATED CIRCUITS, U.S. Pat. No. 5,736,451.

BACKGROUND OF THE INVENTION

1. Field of the Invention

The invention relates to a method for manufacturing semiconductor integrated circuits; more particularly to planar isolation of circuitry on a semiconductor substrate, and to a method for forming isolation regions in a semiconductor substrate between regions containing active circuitry.

2. Discussion of Related Art

FIGS. 1A–1F show a well known method for forming an isolation region in a semiconductor substrate.

In FIG. 1A, a semiconductor substrate 10, such as monocrystalline silicon, is covered with a first buffer layer 12, such as a 12 nm thick layer of silicon oxide. This covering is typically performed by heating the substrate in a dry oxygen containing atmosphere. A second buffer layer 14 is deposited above this first buffer layer. This may be a 50 nm thick polycrystalline or amorphous silicon layer. A masking layer 16 is deposited over the second buffer layer. This masking layer may be a 160 nm thick layer of silicon nitride. The layers 14, 16 are deposited by chemical vapor deposition or any other suitable technique.

In FIG. 1B, a photographic step followed by an etch has removed the masking layer 16 and the second buffer layer 14 from a selected region 18, which is the field region. The region 20 which remains covered with the masking and second buffer layers is the active region.

In FIG. 1C, the structure is heated in an oxidizing atmosphere of hydrogen and oxygen gases at a temperature of 900 to 1100° C. for a controlled time period, to grow a silicon dioxide isolating layer 22 of field oxide to a desired thickness $t_1$, typically in the range 500 to 600 nm.

In an intermediate region 23, between the active region and the field region, the field oxide 22 penetrates under the masking layer 16, consuming part of the second buffer layer 14, to form a region of field oxide having a characteristic shape hereinafter referred to as a "bird's beak". A notch 26 is formed between the tapering surface of the field oxide 22 and the masking layer 16. The bird's beak reduces the effective size of the active region, but does not provide an area of acceptable isolation. It is of limited use, and often regarded as wasted space.

During the oxidation step, a thin native oxide is formed over the masking layer 16. This needs to be removed with an etching step, such as a dip in dilute hydrofluoric acid. As a side effect, some of the field oxide 22 is removed, and now has a thickness of $t_2$. The etch causes a hollow 23a to be etched in the surface of the field oxide.

In FIG. 1D, an isotropic etch step has been used to remove the masking layer. Such an etch may be performed using phosphoric acid to remove a silicon nitride masking layer 16.

In FIG. 1E, the second buffer layer has been removed by a further isotropic etch step, to expose the first buffer layer 12. A suitable plasma etch may be performed to remove a polycrystalline or amorphous silicon layer.

In FIG. 1F, an upper surface 24 of the semiconductor substrate 10 has been exposed by removing the first buffer layer 12, and with it, some of the field oxide 22. This etch may be performed using dilute hydrofluoric acid to remove a silicon dioxide first buffer layer. The etch may be carried out for a time long enough to etch 30 nm of silicon dioxide. This ensures that all of the first buffer layer is removed, but also 30 nm of field oxide.

This field oxide then has a thickness $t_3$, somewhat less than half of which lies above the upper surface 24 of the semiconductor substrate. There is thus a difference in height of almost $½t_3$ between the upper surface of the semiconductor substrate and the upper surface of the field oxide. A sacrificial layer of silicon dioxide is then grown, typically to a thickness of between 10 nm and 80 nm, over the upper surface 24 of the semiconductor substrate, by heating the substrate 10 in a dry, oxygen containing environment, and is later etched away. This serves to clean the upper surface 24.

FIG. 2 is cross section view of a structure according to the described process. A wide field oxide region 22 is shown. The field oxide thickness $t_3$ may typically be 450 to 550 nm, giving a difference in height d between the active region and the field region of about 200 nm. The hollow 23a is present in the upper surface of the field oxide layer. The position of this hollow approximately corresponds to the position of an edge of the masking layer 16. It is typically separated from the interface between the field oxide and the upper surface 24 of the substrate by a distance s of about 160 nm. At the lowest point of this hollow, the thickness h of the field oxide is about 160 nm. A minimum width field region 25a of width wf equal to the minimum width allowed in the process (about 700 nm) is also shown. It is separated from the first field region 22 by an active region of minimum width wa, such as 400 nm. The minimum width field region 25a has a height above the upper surface 24 of the substrate somewhat less than d. A later deposited layer 25b, has an upper surface 25c, which is very uneven, due to the heights of the field regions below.

Highly planar isolation techniques are needed in current and future integrated circuit fabrication processes. The raised surfaces of field oxide regions in the known process described above cause problems with the control of transistor gate lengths when these gate lengths are less than 0.6 μm. Current production of processes with a minimum feature size (i.e. transistor gate length) of 0.5 μm and development of processes with a minimum feature size of 0.35 μm are impeded by problems caused by reflection of light from slanted edges of the field oxide during the photographic definition of the transistor gate features.

In later steps of the process, referring again to FIG. 1F, a gate insulator layer, such as a 10 nm layer of silicon dioxide, is deposited on the upper surface 24 and the field oxide 22. A conductive layer, such as polycrystalline silicon is then deposited over this gate insulator layer. A photolithography step defines transistor gate electrodes. The definition of the gate electrodes is hindered by the reflection of light from slanting edges of the field oxide. This may cause the final gate electrode to be shorter than desired, as the reflected light may act to expose the edges of the photoresist under opaque portions of the mask. The effect varies with distance from the intermediate region 23. The gate lengths produced may vary by as much as 0.1 μm. This represents an intolerable variation for gate lengths of 0.5 μm or less. To overcome the problem, the masks used define gate lengths 0.1 μm longer than necessary, meaning that transistor gates far from the field regions will have gate lengths longer than necessary, and the potential speed and current capabilities will not be achieved.

Variations in the transistor gate lengths also lead to variations in several important transistor parameters, such as on-state saturation current, off-state leakage current and channel breakdown or punchthrough voltage.

The difference in height between the active and field regions could cause some defocusing effects in one region due to the limited depth of focus of the photographic step, and step coverage problems in later deposited conductive layers.

During formation of transistors in the semiconductor substrate, spacers are formed on the gate electrode. The difference in height between active and field regions may cause parasitic spacers to be formed on the slanting edges of the field oxide, which later cause problems with interconnect lines running over field regions to connect different active regions together.

Later deposited layers, such as polycrystalline silicon interconnect, metal interconnect and photoresist layers at each masking step are thinner at the point that they cross the intermediate region 23, due to step coverage problems.

For all of these reasons, it is desired to produce a semiconductor substrate with isolating field regions that are coplanar with the upper surface of the semiconductor substrate.

Several techniques are known for achieving a field isolation region which is relatively coplanar with the upper surface of the semiconductor substrate.

A "double field oxidation", process exists, whereby field 18 and active 20 regions are defined as shown in FIGS. 1A, 1B. A first oxidation step takes place, similarly to that shown in FIG. 1C. This first field oxide is then completely etched away, leaving the field region with an exposed semiconductor surface at a depth of about ½$t_1$ below the upper surface 24 of the semiconductor substrate. A second oxidation step is then performed. If a second oxide of thickness $t_1$ is formed, the upper surface of this oxide will be approximately coplanar with the upper surface 24 of the semiconductor substrate.

This process causes the extension of the bird's beak. As two oxidation process steps are performed, the beak is twice the length of the beak formed in processes using only one oxidation step. This process requires a large number of process steps. The processing time is raised by the need for two oxidation steps, at 5 or 6 hours each. A large "bird's head" is formed, reducing the planarity achieved. A bird's head is caused by deformation of a bird's beak. As the second oxidation step is performed on a recessed field region, the tapering bird's beak formed during this second oxidation step is curved around the edge of the recess, there producing a bump having the form of a bird's head. This reduces the planarity of the resulting surface, and makes formation of later deposited, overlying layers more difficult.

The problem of the raised field oxide surface may also be treated by introducing an etchback or polishing step, after the formation of the field oxide 22.

FIGS. 3A to 3C show a sequence of process steps illustrating the etchback technique. Features common to FIG. 1 have identical reference labels.

In FIG. 3A, a field oxide 22 is formed to a thickness $t_1$ in the field region 18, according to the process of FIGS. 1A to 1C. A notch 26 is present between the edge of the masking layer 16 and the upper surface of the field oxide 22. In the region of this notch, the thickness of the field oxide is reduced, where the "bird's beak" begins. A selective etch step is then used to remove some of the field oxide from its upper surface until this upper surface is only slightly higher than the upper surface 24 of the semiconductor substrate.

FIG. 3B shows the oxide, etched to have a thickness of $t_4$. This etch step, however, causes a gap 28 to be formed under the masking and second buffer layers, exposing a part of the semiconductor substrate 10.

In FIG. 3C, the layers 16, 14 have been removed by selective etching. The first buffer layer 12 has also been removed, to expose the upper surface 24 of the semiconductor substrate 10. Some or all of these etch steps have the effect of also reducing the thickness of the field oxide. At the end of the process, the upper surface of the field oxide is at a height d above the upper surface of the semiconductor substrate 10.

FIG. 4 is a cross section view of a structure according to this process. The total field oxide thickness $t_4$ may typically be 300 to 400 nm. The difference in height d between the active region and the field region when produced according to this process is about 100 nm. The gap 28 is present. It is a more extreme form of the hollow 25 a discussed earlier. This is caused by the etching step applied to the field oxide being active for longer on exposed parts of the field oxide than on parts which were covered by masking layer 16 or second buffer layer 14. In the diagram, the gap is shown as not exposing an edge of the active region, but a thin region 28a of field oxide remains. This is, however, difficult to control and edges of the active region are often exposed. At the lowest point of the surface of the field oxide, in this gap, the thickness h of the field oxide is about 80 nm. This lowest point is separated from the edge of the active area by a distance s of about 0.15 to 0.2 µm, typically 0.16 µm. Again, a minimum width field region 25a of width wf equal to the minimum width allowed in the process is also shown. This field region has a height above the substrate surface 24 somewhat less than d. A later deposited layer 25b, has an upper surface 25c. This upper surface is more planar than that of the previous process, shown in FIG. 2, as the field region 22 is more nearly coplanar with the surface 24 of the substrate.

The gap 28 and the thin or missing portion 28a of field oxide, which are introduced by the use of this etchback process, introduce unacceptable electrical problems. They cause a site for origination and growth of defects at the edge of the active region. This causes defects in a later formed gate oxide and allows current leakage paths in the final circuit.

A similar, but alternative method involves forming a field oxide as in FIG. 3A, then subjecting the structure to a chemical-mechanical polishing (CMP) step, to planarize the field oxide with the active region, and remove the barrier layers.

Such a CMP step must be controlled to stop on the surface 24 of the semiconductor substrate, which is difficult in the case of a silicon substrate, as silicon of the substrate 10 will be polished faster than the field oxide 22. The introduction of a polishing step into a process is time consuming and complicated.

In either of these two processes, spacers may be formed on the masking layer 16, which then separates the field oxide formation from the masking and buffer layers, and reduces the length of the bird's beak under the masking layer 16. This has no effect on the planarity of the final structure.

FIGS. 5A to 5D show this process variant.

In FIG. 5A, after the definition of the field region 18 and the active region 20, a layer 30 of spacer material, such as silicon nitride, is deposited over the surface of the structure. This layer is then etched, to leave a spacer, 32, as shown in FIG. 5B.

The field region is then oxidized, FIG. 5C, to form a field oxide 22 having a thickness $t_1$, typically 500 to 600 nm. As the bird's beak formed in this oxidation penetrates under the spacer 32 as well as under the masking layer 16, the length of the bird's beak under the masking layer is reduced by the width of the spacer 32.

As shown in FIG. 5D, the field oxide 22 and the spacer may be etched to improve planarity, but the problem of the gap 28 remains. The remaining thickness $t_4$ of field isolation still protrudes significantly above the upper surface 24 of the semiconductor substrate.

Other techniques are known, which aim to improve the planarity of the isolation area whilst eliminating or reducing the length of the bird's beak. For example, a cavity may be etched in the surface of the semiconductor, which is then filled with a deposited isolating material. This deposited isolating material is then etched or polished to be coplanar with the upper surface of the semiconductor. This however is a complex process, and the isolating material (commonly silicon dioxide) deposited is often of a relatively poor quality, containing impurities, and having a low dielectric strength.

In current and future semiconductor fabrication techniques, the control of the length of transistor gate electrodes is more important than the space savings that could be made by the reduction in the length of the bird's beak.

The current invention therefore does not address the reduction in size of the bird's beak, but provides a simple process for the production of a coplanar isolation region, without introducing the defectivity problems of the prior art.

The current invention seeks, in a semiconductor device, to provide a simple method of producing field isolation regions, whose upper surface is approximately coplanar with the upper surface of the semiconductor substrate, while preventing the exposure of the edges of active regions. This and other aims of the invention will be apparent to those skilled in the art upon reading the following summary of the invention.

SUMMARY OF THE INVENTION

Accordingly, one aspect of the invention provides a method for producing an isolation region on an upper surface of a semiconductor substrate comprising the steps of: forming a masking layer on the upper surface of the semiconductor substrate; defining an active region and a field region by patterning of the masking layer, the active region being covered with the masking layer; forming an isolating layer having upper and lower limits on the field region such that the lower limit of the isolating layer lies below the upper surface of the semiconductor substrate, and that a notch exists between the edge of the masking layer and the upper limit of the isolating layer; depositing a filling layer over the masking layer and the isolating layer, such that it completely fills the notch; selectively etching the filling layer to expose the upper limit of the isolating layer, the notch remaining filled with a portion of the filling layer; partially removing the isolating layer from its upper limit until this upper limit is substantially coplanar with the upper surface of the semiconductor substrate; removing the masking layer.

Embodiments of this aspect of the invention may include one or more variations, as described below.

According to an embodiment of the invention, a first buffer layer is formed on the upper surface of the semiconductor substrate, under the masking layer. The active and field regions are then defined by patterning the masking layer.

According to an embodiment of the invention, a second buffer layer is formed on the first buffer layer and the semiconductor substrate.

According to an embodiment of the invention, the portion of the filling layer filling the notch is removed at the same time as the masking layer.

According to an embodiment of the invention, the semiconductor substrate is composed of silicon, the masking layer is composed of silicon nitride, the isolating layer is composed of silicon dioxide and the filling layer is composed of silicon nitride.

According to an embodiment of the invention, the first buffer layer is composed of silicon dioxide, and the second buffer layer is composed of polycrystalline silicon, or amorphous silicon.

The present invention may be embodied in a semiconductor substrate having a transistor with a gate of minimum length, a minimum width isolation region and a wide field isolation region incorporated thereon, the isolation regions having upper surfaces which are substantially coplanar with an upper surface of the semiconductor substrate; a hollow being present in the upper surface of the wide field isolation region, at a distance p from an interface with the upper surface of the semiconductor substrate, characterized in that the width wf of the minimum width field isolation region is less than the sum of the length of the gate and twice the distance p. In a variation, the thickness of the minimum width field region below the upper surface of the semiconductor substrate is at least 60% of the thickness of the wide field region below the upper surface of the semiconductor substrate. In yet another variation, the semiconductor substrate may have constructed thereon an integrated circuit incorporating the above-described isolation regions. The semiconductor substrate described above may further include circuit elements to form an integrated circuit. A transistor may be produced in a semiconductor substrate, having a minimum gate length, a minimum width isolation region and wide field isolation region. The isolation regions have substantially coplanar surfaces, also coplanar with an upper surface of the semiconductor substrate. The wide field isolation region has, in an upper surface, a hollow located a distance p from an interface with the upper surface of the semiconductor substrate and the minimum width isolation region has a width less than the sum of the gate length and 2 p.

BRIEF DESCRIPTION OF THE DRAWINGS

In the drawings, in which like reference designations indicate like elements:

FIGS. 6A–6G are sectional views illustrating successive steps of a method of forming a field isolation region which is approximately coplanar with the semiconductor substrate surface, according to the invention.

DETAILED DESCRIPTION

According to the invention, a method is provided for producing field isolation regions in semiconductor devices, whose upper surfaces are approximately coplanar with the upper surface of the semiconductor substrate, and which do not have gaps formed in the isolation at edges of active regions.

Figure 1A:
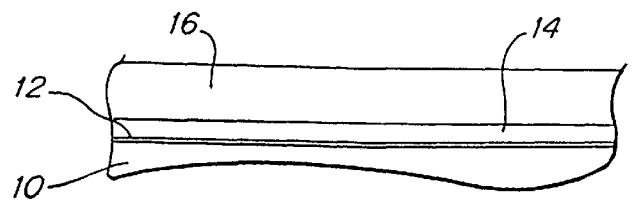
FIGS. 1A–1F are sectional views illustrating successive steps of a prior art method of producing a field isolation region in a semiconductor substrate.
Figure 1B:
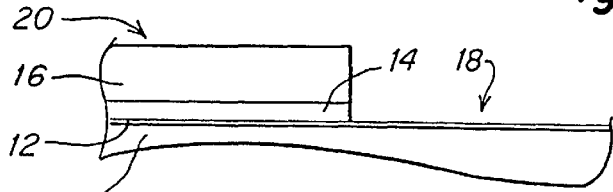
Figure 1C:
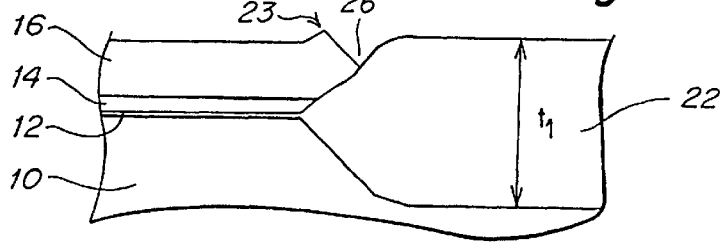
Figure 1D:
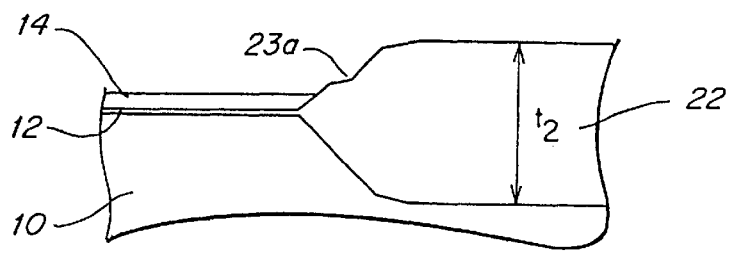
Figure 1E:
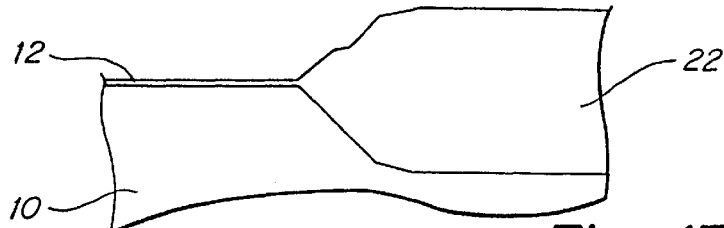
Figure 1F:
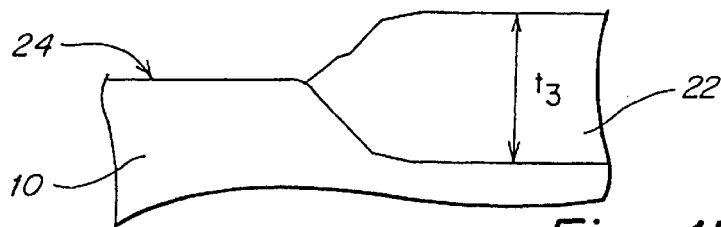

FIGS. 6A to 6G show stages in the process of the invention. In FIG. 6A, a semiconductor substrate 10 has been provided with a first buffer layer 12, a second buffer layer 14 and a masking layer 16, all overlying an active region 20; and a field isolation layer 22 of thickness $t_1$, in a field region 18. This structure may be prepared according to the method described in relation to FIGS. 1A–1C. Notch 26 is present between the masking layer 16 and the upper surface of the field oxide layer 22. Typically, the semiconductor substrate is composed of silicon, the first buffer layer 12 and the field isolation region 22 are composed of silicon dioxide, the second buffer layer 14 is composed of polycrystalline silicon, and the masking layer 16 is composed of silicon nitride. During formation of the field isolation layer, a native oxide layer is formed over the nitride masking layer. This is removed, as described earlier, by dipping the structure in dilute hydrofluoric acid, or another equivalent etch step.

In FIG. 6B, a filling layer 34 is formed over the surface of the structure. This layer must be sufficiently thick to fill the notch 26. This filling layer must be able to be selectively etched with respect to the material of the insulating layer, with an easy to detect end point. The filling layer may typically be formed of silicon nitride; a 160 nm layer of silicon nitride appears suitable.

Such a silicon nitride filling layer may be formed by chemical vapor deposition using a mixture of dichlorosilane ($SiH_2Cl_2$) and ammonia ($NH_3$) at 750° C. The filling layer 34 thus formed may then be anisotropically etched, such as by using a plasma of carbon tetrafluoride ($CF_4$), trichloromethane ($CHF_3$) and sulfur hexafluoride ($SF_6$). The end point may be detected by the variation in optical spectroscopy of the plasma, when the etch reaches the field oxide layer.

FIG. 6C shows the structure after this etch step. The filling layer is removed from the entire surface of the structure, except in the notch 26. Here, a small remaining part 36 (a "field protection spacer") remains. An etch step is then performed which selectively etches the material of the isolation layer. This etch step may be an isotropic, wet etch step using dilute hydrofluoric acid to remove 100 to 200 nm of field oxide.

FIG. 6D shows the results of such an etch. The field protection spacer 36 is not removed with the etching step which etches the field isolation region. The etch is applied such that the isolating layer has a thickness of $t_5$, selected so that the upper surface of the isolation region is substantially planar with, but slightly higher than, the upper surface of the semiconductor substrate 10.

FIGS. 6E, 6F, 6G show subsequent process steps whereby the masking layer 16, the second buffer layer 14 and the first buffer layer 12 are subsequently removed in suitable etching steps, as previously discussed.

As shown in FIG. 6G, the upper surface 24 of the semiconductor substrate is exposed, and a field isolation region 22 is produced, which does not expose the edge of the semiconductor substrate in the active region. The field isolation region has an upper surface which is higher than the upper surface by an amount $t_6$, which is significantly less than the thickness d previously achieved.

Figure 7:
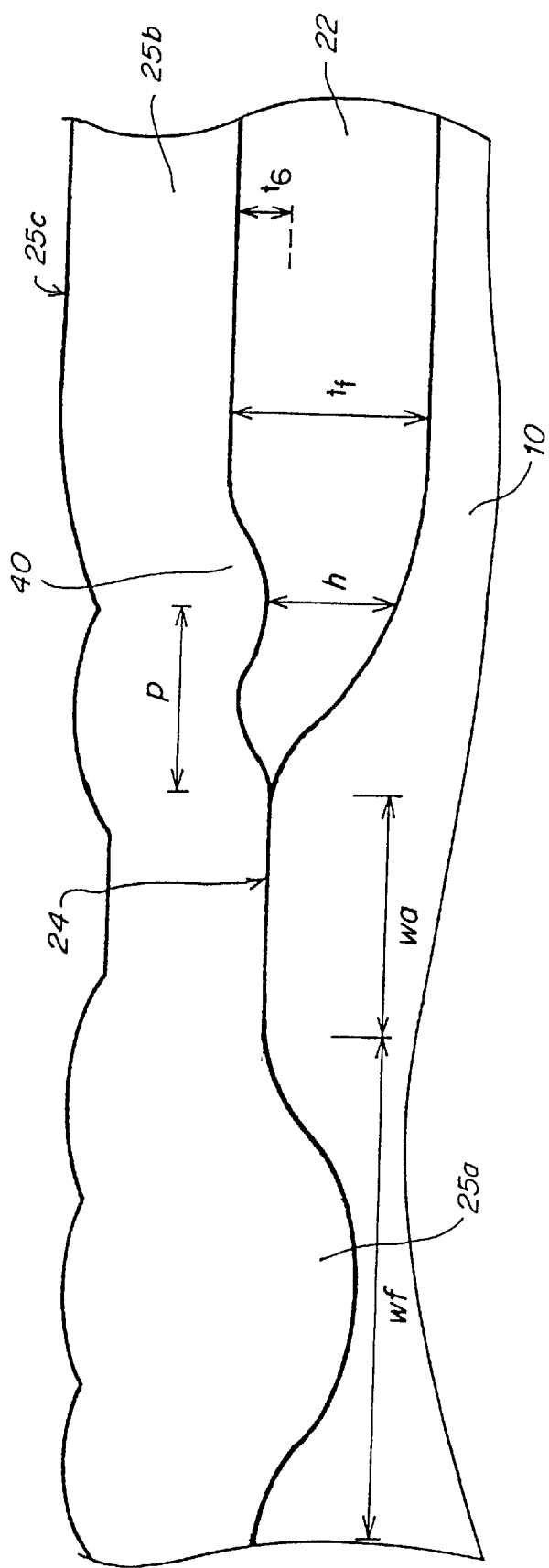
FIG. 7 shows, figuratively, the characteristic cross-section of an isolation region produced according to the method of the invention.

The isolation region 22 which remains has a characteristic cross section, which is illustrated in FIG. 7. The total field oxide thickness $t_f$ may typically be 300 to 400 nm. The difference in height $t_6$ between the active region and the field region when produced according to the process of the invention is about 100 nm. This is a compromise between coplanarity of the field oxide and the semiconductor surface 24, and protection of the edge of the semiconductor substrate.

A hollow 40 is present in the upper surface of the field oxide layer. This is caused by the etching of the field oxide being more pronounced at the edge of field protection spacer 36, the field oxide 22 being slightly thinner at this point (FIG. 6C, 37). The position of this hollow approximately corresponds to the position of an edge of the field protection spacer 36. This hollow has a deepest point separated from a nearest edge of the active region by a distance p, which is between 0.25 and 0.35 $\mu$m, typically 0.27 $\mu$m, significantly longer than the separation s achieved with previous processes. At the lowest point of this hollow, the thickness h of the field oxide is about 180 nm, significantly more than achieved with previous processes.

Again, a minimum width field region 25a of width wf equal to the minimum width allowed in the process is also shown. This field region has a height above the substrate surface 24 no more than $t_6$.

The distance p is an apparent bird's beak length. It is typically 0.25 to 0.30 $\mu$m.

In a typical 0.5 $\mu$m minimum feature size process, the minimum width field region 25a will have a width wf of less than 1.0 $\mu$m, such as 0.7 $\mu$m.

The minimum field width wf is equal to the drawn field width (the size of a feature formed in the masking layer prior to oxidation to form the field oxide), extended by a bird's beak length on either side. However, in this case, the minimum field width wf, less two apparent bird's beak lengths of 0.3 $\mu$m each gives a drawn field width of 0.1 $\mu$m. This would not be possible to achieve in a process with a minimum drawn feature size of 0.35 $\mu$m to 0.5 $\mu$m, as definition of mask features of less than this minimum feature size is not possible.

Furthermore, in the structure of FIG. 7, the depth of the field oxide below the semiconductor surface 24 in the minimum width portion 25a is over 60% of the depth of the field oxide below the semiconductor surface in the wide field oxide region, 22.

This would not be possible with a very narrow drawn field oxide, due to the oxide thinning effect. This effect causes narrow regions of field oxide to be thinner than wide regions, for given oxidation conditions. The effect begins with drawn widths of less than 0.7 $\mu$m, and would be severe for a drawn width of 0.1 $\mu$m. This effect is explained, for example, in "Solid State Technology", November 1994, pages 70–71.

The above described form of the field regions 25a, 22 is characteristic of a structure produced according to the method of the invention. It can be deduced from the width wf, and the minimum feature size of the technology in question, that the apparent bird's beak length p is not the actual bird's beak length, and that the field protection spacers of the invention have been used.

Deeper, narrower minimum width field regions 25a may be produced according to the invention, without the risk of exposing edges of the active area.

Figure 2:
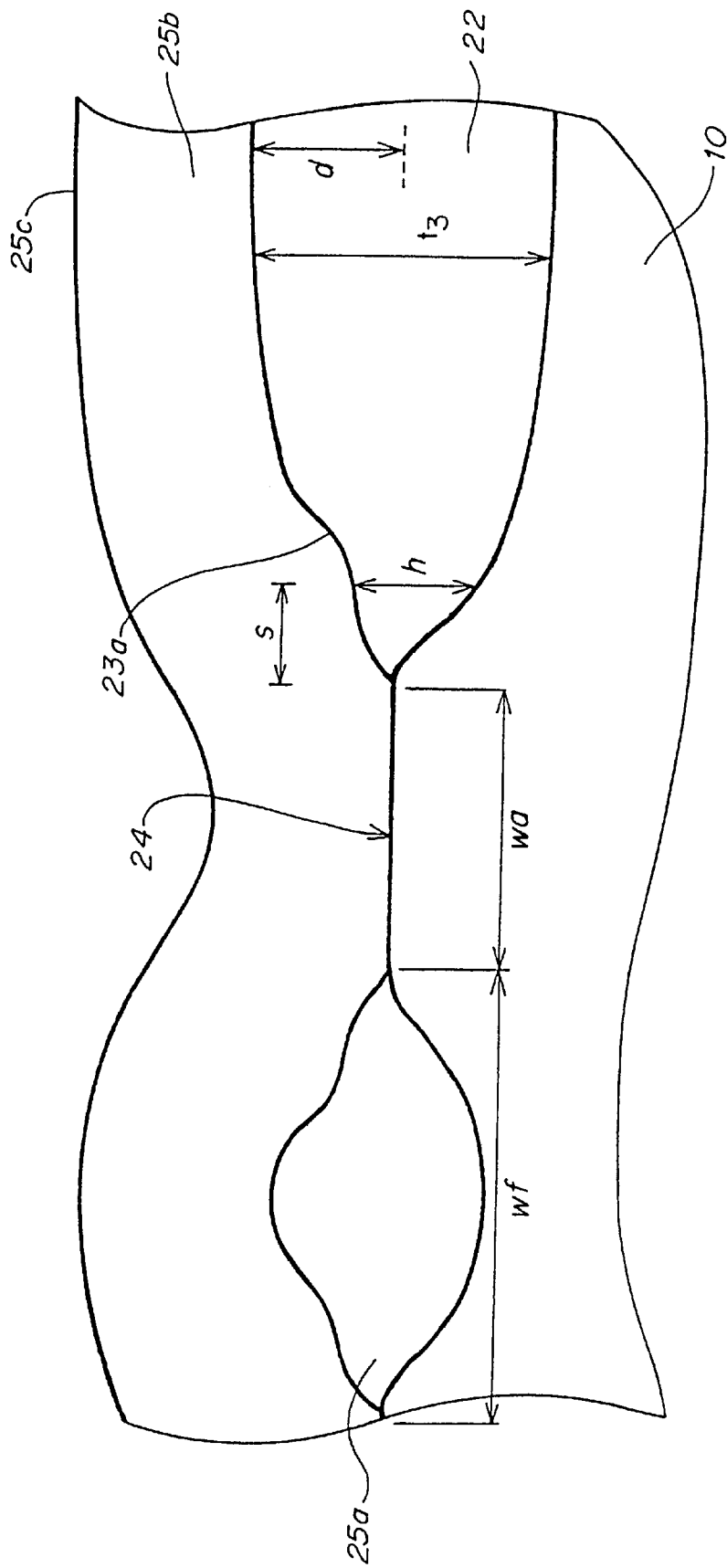
FIG. 2 shows a cross section of a structure produced according to the method of FIG. 1.
Figure 3A:
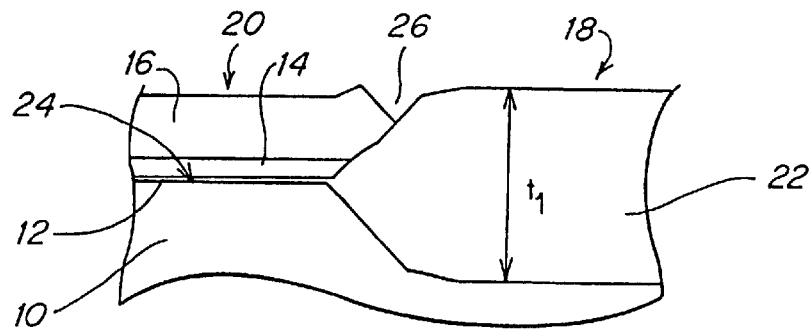
FIGS. 3A–3C are sectional views illustrating successive steps of an alternative prior art method of producing a field isolation region in a semiconductor substrate.
Figure 3B:
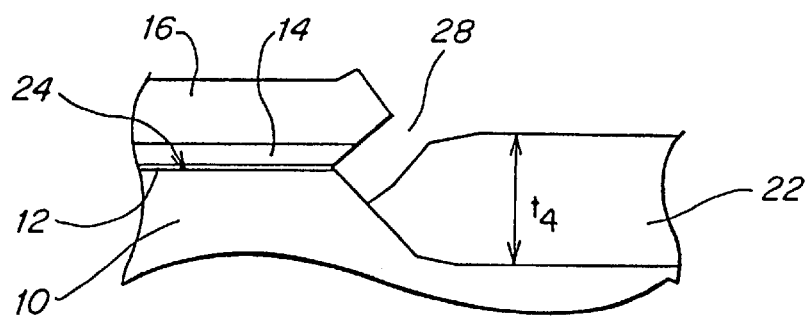
Figure 3C:
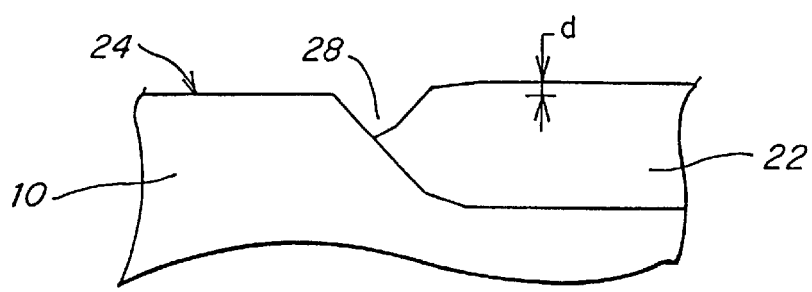
Figure 4:
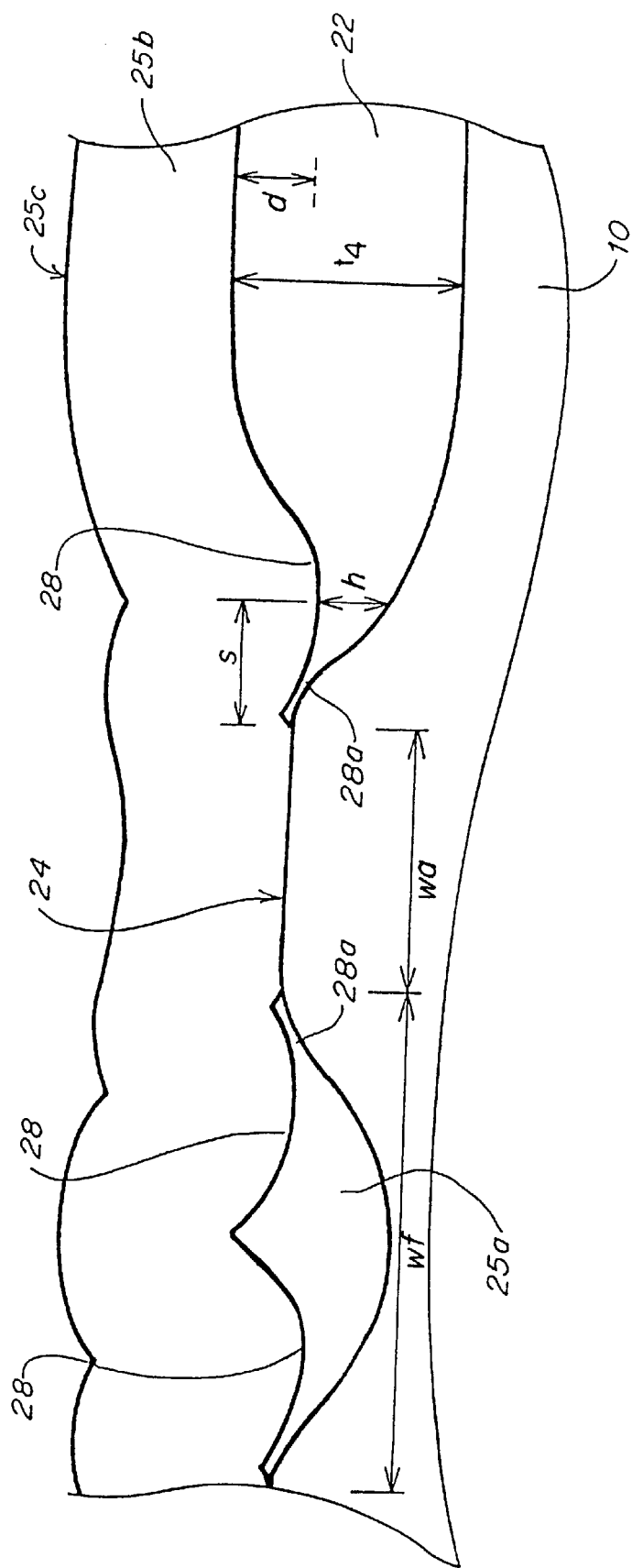
FIG. 4 shows a cross section of a structure produced according to the method of FIG. 3.
Figure 5A:
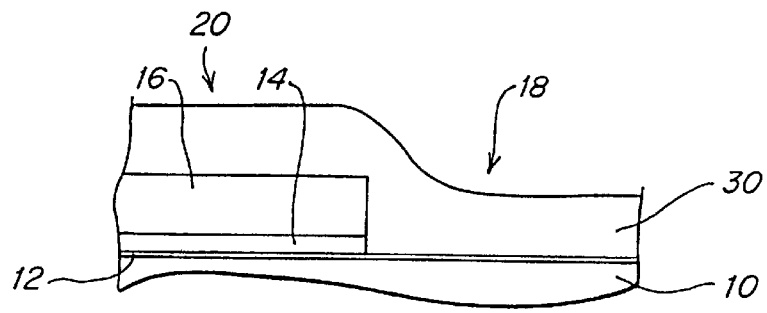
FIGS. 5A–5D are sectional views illustrating successive steps of a variant of the process of FIG. 3.
Figure 5B:
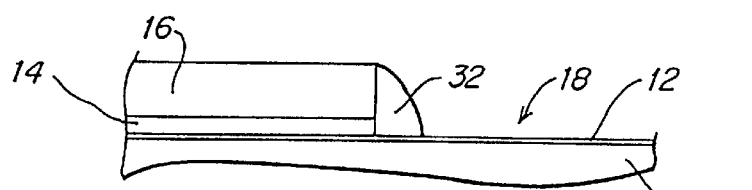
Figure 5C:
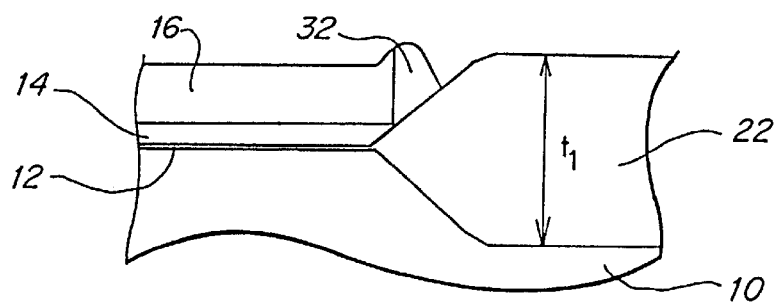
Figure 5D:
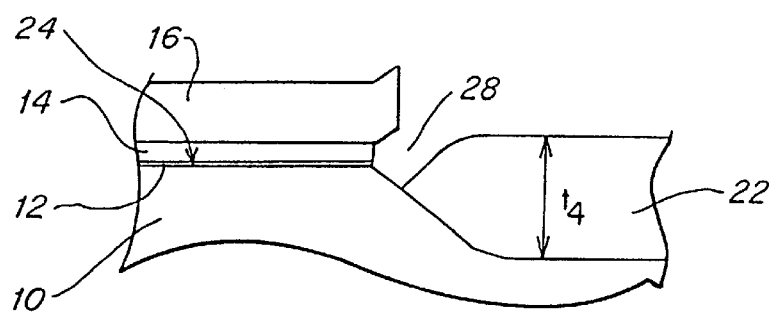

A later deposited layer 25b has an upper surface 25c. This upper surface is far more planar than that of the previous processes, such as those shown in FIGS. 2, 4.

The field oxide 22 is substantially coplanar with the semiconductor surface, and the problems of the prior art concerning reflections of light, and thinning of subsequent layers at the interface between field and active regions, are avoided.

Although the invention has been described in relation to one particular embodiment, numerous variations will be apparent to one skilled in the art. One buffer layer may be used instead of two; the buffer layers may be composed of any suitable material. By careful choice of material for the masking layer, the need for a buffer layer may be avoided.

The technique may also be adapted for use with deposited isolation regions, the advantage of the invention being to allow the planarization of an isolation layer without exposing an edge of the underlying semiconductor substrate, which itself causes defects in later formed devices.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended to be limiting. The invention is limited only as defined in the following claims and the equivalents thereto.

What is claimed is:

1. A semiconductor substrate having an active region with a width wa, a first field isolation region and a second field isolation region incorporated thereon, the first and second field isolation regions having upper surfaces which are not more than about 100 nm above an upper surface of the active region; a hollow having a deepest point being present in the upper surface of the second field isolation region, at a distance p from an interface with the upper surface of the semiconductor substrate, characterized in that the width wf of the first field isolation region is less than the sum of the width wa of the active region and twice the distance p; and the thickness of the second field isolation layer at the deepest point of the hollow being about 180 nm.

2. The semiconductor substrate according to claim 1 wherein the thickness of the first field isolation region below the upper surface of the semiconductor substrate is at least 60% of the thickness of the second field isolation region below the upper surface of the semiconductor substrate.

3. The semiconductor substrate of claim 1, on which is constructed an integrated circuit incorporating the first and second isolation regions.

4. The semiconductor substrate of claim 1, having active regions and field isolation elements arranged as circuit elements of an integrated circuit.

* * * * *

UNITED STATES PATENT AND TRADEMARK OFFICE
CERTIFICATE OF CORRECTION

PATENT NO. : 6,525,393 B1  
DATED : February 25, 2003  
INVENTOR(S) : Philippe Gayet Page 1 of 1

It is certified that error appears in the above-identified patent and that said Letters Patent is hereby corrected as shown below:

<u>Title page,</u>  
Item [54], should read:  
-- [54] METHOD OF FORMING PLANAR ISOLATION IN INTEGRATED CIRCUITS --

Item [30], should read:  
-- [30]  Foreign Application Priority Data  
May 19, 1995   (FR)…………….....95 06266 --

Signed and Sealed this

Fifteenth Day of July, 2003

JAMES E. ROGAN  
*Director of the United States Patent and Trademark Office*